(12) United States Patent
Kim et al.

(10) Patent No.: US 8,089,804 B2
(45) Date of Patent: Jan. 3, 2012

(54) NON-VOLATILE SEMICONDUCTOR MEMORY DEVICE USING WEAK CELLS AS READING IDENTIFIER

(75) Inventors: Hoo-Sung Kim, Gyeonggi-do (KR); Eui-Gyu Han, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1143 days.

(21) Appl. No.: 11/810,554

(22) Filed: Jun. 6, 2007

(65) Prior Publication Data

US 2008/0106935 A1    May 8, 2008

(30) Foreign Application Priority Data

Nov. 3, 2006  (KR) .................. 10-2006-0108360

(51) Int. Cl.
*G11C 11/34* (2006.01)
*G11C 16/04* (2006.01)

(52) U.S. Cl. ........... 365/185.02; 365/185.18; 365/185.2; 365/222

(58) Field of Classification Search ............. 365/185.02, 365/185.18, 185.2, 222
See application file for complete search history.

(56) References Cited

U.S. PATENT DOCUMENTS

| | | | | |
|---|---|---|---|---|
| 5,699,297 A * | 12/1997 | Yamazaki et al. | ....... | 365/185.25 |
| 6,707,714 B2 | 3/2004 | Kawamura | ............... | 365/185.11 |
| 6,714,473 B1 * | 3/2004 | Fiscus | ...................... | 365/189.07 |
| 6,819,589 B1 | 11/2004 | Aakjer | ...................... | 365/185.02 |
| 6,967,867 B2 * | 11/2005 | Hamaguchi | ............. | 365/185.03 |
| 7,009,890 B2 | 3/2006 | Yamazoe et al. | .......... | 365/189.01 |
| 7,035,143 B2 | 4/2006 | Lee | .......................... | 365/185.17 |
| 7,075,839 B2 * | 7/2006 | Mukunoki et al. | ............ | 365/201 |
| 2004/0170060 A1 | 9/2004 | Ishimoto | | |

* cited by examiner

*Primary Examiner* — Hoai V Ho
*Assistant Examiner* — Kretelia Graham
(74) *Attorney, Agent, or Firm* — Myers Bigel Sibley & Sajovec, P.A.

(57) ABSTRACT

A non-volatile semiconductor memory is configured to monitor for onset of a read disturbance (e.g., due to soft programming) and to carry out operations to protect data therein. A non-volatile semiconductor memory has a memory cell array that includes normal memory cells and a flag memory cell. The flag memory cell is configured to be more susceptible to electrical stress on its retention of data than the normal memory cells. The memory monitors data stored in the flag memory cell to monitor a data retention characteristic of the normal memory cells.

6 Claims, 6 Drawing Sheets

NON-VOLATILE SEMICONDUCTOR MEMORY DEVICE USING WEAK CELLS AS READING IDENTIFIER

CROSS-REFERENCE TO RELATED APPLICATION

This application claims the benefit of Korean Patent Application No. 10-2006-0108360, filed Nov. 3, 2006, the disclosure of which is hereby incorporated herein by reference in its entirety.

FIELD OF THE INVENTION

The present invention relates to non-volatile semiconductor memories and, more particularly, to non-volatile semiconductor memories that store data by implanting charges into a floating gate or discharging the charges therefrom.

BACKGROUND OF THE INVENTION

In recent years, with the rapid development of information processing devices such as computers, high-speed and high-capacity semiconductor memory devices are being employed as key components of the information processing devices.

Typically, semiconductor memory devices may be classified into volatile semiconductor memory devices and non-volatile semiconductor memory devices. The volatile semiconductor memory devices may be further classified as dynamic random access memories and static random access memories. A volatile semiconductor memory device is fast in read and write operation but loses data when its memory cells are powered off. Non-volatile semiconductor memory devices may be further classified as a mask read only memory (MROM), a programmable read only memory (PROM), an erasable and programmable read only memory (EPROM), an electrically erasable programmable read only memory (EEPROM), and the like.

A non-volatile semiconductor memory device can permanently retain data in its memory cells even when powered off, and accordingly can be used to retain data irrespective of its power state. Once MROM, PROM, or EPROM is installed within an electronic system, it can be difficult to erase or write (program) data therein. In contrast, the EEPROM can be electrically erasable and writable more easily after installation into an electronic system using the system itself and, therefore, is increasingly being used as a system program storage unit or subsidiary storage unit which can be continuously updated.

There is a continuing demand to develop higher-density and higher-performance EEPROM devices for use in, for example, computer or microprocessor controlled electronic devices such as digital cameras and portable/notebook computers where the EEPROM may be used in place of, or to supplement, hard disk drives.

With the advance of EEPROM design and fabrication techniques, a NAND type flash EEPROM provides a flash erase function. The flash EEPROM can serve as a high-density and high-capacity subsidiary storage unit because of its higher integration than a typical EEPROM. The flash EEPROMs may be classified into a NAND type, a NOR type, and an AND type depending on the structure of the EEPROM unit memory cell array. The NAND type flash EEPROM has a higher integration than the NOR/NAND flash EEPROM, as well known in the art.

FIG. 1 is a block diagram of a conventional non-volatile semiconductor memory device, and FIG. 2 is a cross-sectional view of memory cells in the memory cell array of FIG. 1.

Referring to FIG. 1, a NAND type EEPROM memory device includes a data input/output buffer 58, a row decoder 52 for selecting word lines, a column decoder 54, a column gate 55, a sense amplifier circuit 53 for sensing and storing input/output data in memory cell transistors, a booster circuit 56 for generating a boosting voltage, a control circuit 57 for controlling operation of the memory device, and a memory cell array 51.

The memory cell array 51 includes bit lines BL 19 for transferring data to and from the memory cell transistors in a NAND cell unit (or a cell string), and word lines WL for controlling gates of the memory cell transistors and the select transistors in the NAND cell unit. The word lines WL intersect the bit lines BL 19.

Referring to FIG. 2, which shows a cross-sectional view of memory cells in the memory cell array 51 of FIG. 1, the memory cells form a NAND cell unit in a p-type well 12 formed on an n-type well 11, which is formed on a p-type substrate 10. The NAND cell unit includes a first selection transistor SST having a drain connected to the bit line 19, a second selection transistor ST having a source connected to a common source line, and 16 memory cell transistors (located under word lines WLO to WL15 and connected to the word lines WLO to WL15) having channels connected in series between a source of the first selection transistor SST and a drain of the second selection transistor ST, and which are covered by an insulation layer 18. The NAND cell unit is formed on the P-type well 12. Each memory cell transistor includes a floating gate (FG) 15 formed on the channel between source and drain regions 21 with a gate oxide layer 14 interposed between the floating gate 15 and the channel, and a control gate (CG) 17 formed over the floating gate 15 via an interlayer insulating film 16. Charges are accumulated in the floating gate 15 and function as program data by a program voltage applied to the control gate 17.

Erase, write, and read operations of the EEPROM of a NAND type will be described. The erase and write (or program) operations are conventionally performed using F-N tunneling current. For example, in the erasure operation, a very high voltage is applied to a substrate and a low voltage is applied to the CG. In this case, a floating-gate voltage Vfg is determined by a coupling ratio of a capacitance between the CG and the FG and a capacitance between the FG and the substrate, and is applied to the FG. When a voltage difference between the floating-gate voltage Vfg applied to the FG and the substrate voltage Vsub applied to the substrate is greater than a voltage difference for F-N tunneling, the electrons accumulated in the FG move to the substrate. The electron movement decreases a threshold voltage Vt of the memory cell transistor having the CG, the FG, the source and the drain. When a sufficiently high voltage is applied to the drain, current flows, because the Vt sufficiently decreases, even though 0V is applied to the CG and the source. This state is considered to be "erased" and commonly indicated as logic "1".

In contrast, in the write operation, 0V is applied to the source and the drain and a very high voltage is applied to the CG. In this case, an inversion layer is formed in the channel and both the source and the drain will have a potential of 0V. If a voltage difference between the floating-gate voltage Vfg, determined by a coupling ratio of a capacitance between the CG and the FG and a capacitance between the FG and the substrate, and the channel voltage Vchannel (0V) is enough to cause F-N tunneling, the electrons move from the channel region to the FG. The electron movement increases the threshold voltage Vt. Even though a predetermined voltage is applied to the CG, 0V is applied to the source and a proper voltage is applied to the drain, the current does not flow. This state is considered to be "programmed" and commonly indicated as logic "0".

In the structure of the memory cell array, a unit page refers to memory cell transistors having control gates connected to one word line in common. Each of a plurality of pages including a plurality of memory cell transistors is called a cell block. A unit cell block commonly includes one or more cell strings per bit line. The NAND flash memory has a page program mode for fast programming. Page program operation includes data loading operation and program operation. In the data loading operation, data in bytes from input/output terminals are sequentially latched and stored in data registers. The data registers correspond to the bit lines, respectively. In the program operation, the data in the data registers are simultaneously written to memory cell transistors on the selected word line via the bit lines.

As described above, in the NAND type EEPROM, the read, program, and write operations are generally performed in units of page while the erasure operation is performed in units of block. In fact, the electron movement between the FG and the channel of the memory cell transistor occurs only in the program and erasure operations. In the read operation, data is read from memory cell transistors without the risk of causing data loss after the erase and program operations are terminated.

In the read operation, a higher voltage (typically, a read voltage) than a voltage (typically, a ground voltage) applied to the CG of the selected memory cell transistor is applied to the CG of an unselected memory cell transistor. Accordingly, current flows or does not flow on a corresponding bit line depending on a program state of the selected memory cell transistor. If a threshold voltage of the programmed memory cell is higher than a reference value in a determined voltage condition, the memory cell is detected as an off-cell and a high voltage is charged on a relevant bit line. In contrast, if the threshold voltage of the programmed memory cell is lower than the reference value, the memory cell is detected as an on-cell, and a relevant bit line is discharged to a low level. This bit line state is finally detected as "0" or "1" by a sense amplifier (53 of FIG. 1) called a page buffer.

In a memory cell area of the flash EEPROM, an area on which the read operation is mainly performed may be an area storing a few code data, such as ROM table information or indexing information to data in a main memory cell array, which needs to be fast accessed. Read disturbance caused by read operation occurs in memory cells belonging to such an area. That is, after code data is read from the memory cells over threshold times, reading data fails due to read voltage stress applied each time the memory cells are not selected, resulting in a read error.

Consequently, as the read operation is repetitively performed more than a threshold number of times on a specific memory cell area, the threshold voltage of memory cells may vary, resulting in a read error. In this case, it is difficult to correct data having a read error using, for example, an error correction code, and which results in an entire memory device defect.

Accordingly, there is a need for a solution for preventing, in advance, a read error due to read disturbance in a non-volatile semiconductor memory.

SUMMARY OF THE INVENTION

In some embodiments of the present invention, a non-volatile semiconductor memory is configured to monitor for onset of a read disturbance (e.g., due to soft programming) and to carry out operations to protect data therein. The non-volatile memory may identify the onset of a read disturbance by detecting a change in data stored in a weak "flag"/"indicating" cell which is more susceptible to read disturbances than other "normal" cells of a memory array. The non-volatile semiconductor memory device, such as a flash EEPROM, may be capable of effectively preventing a read error in the normal cells due to read disturbances.

Exemplary embodiments of the present invention provide a non-volatile semiconductor memory with a memory cell array. The memory cell array includes normal memory cells and a flag memory cell that is configured to be more susceptible to electrical stress on its retention of data than the normal memory cells and is used to monitor a data retention characteristic of the normal memory cells.

The flag memory cell may be configured to have a greater coupling ratio than the normal memory cell. The flag memory cell may be configured to be more susceptible to soft programming than the normal memory cells and/or may be configured to be more susceptible to read disturbance of stored data therein than the normal memory cells. The non-volatile semiconductor memory may be configured to back up data stored in the normal memory cells in response to change in data in the flag memory cell.

Other exemplary embodiments of the present invention provide an electrically erasable programmable read only memory (EEPROM) type non-volatile semiconductor memory with a memory cell array. The memory cell array includes normal memory cells with MOS transistors each having a floating gate for storing data and a control gate, and a flag memory cell that is configured to be more susceptible to electrical stress on its retention of data than the normal memory cells and is used to monitor a data retention characteristic of the normal memory cells.

The flag memory cell may include a floating gate having a greater width than that of the floating gates of the normal memory cells. The flag memory cell may be configured to be more susceptible to read disturbance of stored data therein than the normal memory cells. The non-volatile semiconductor memory may be configured to back up data stored in the normal memory cells in response to change in data in the flag memory cell.

Other exemplary embodiments of the present invention provide a EEPROM type non-volatile semiconductor memory device that includes a memory cell array and a reading circuit. The memory cell array includes normal memory cells including MOS transistors each having a floating gate for storing data and a control gate, and flag memory cells each corresponding to one of the normal memory cells. The flag memory cells are of the same type as the normal memory cells and are configured to be more susceptible to electrical stress on their retention of data than the normal memory cells. The reading circuit is configured to select ones of the normal memory cells corresponding to an input address and to read data from the selected normal memory cells. The reading circuit reads data from at least one of the flag memory cells corresponding to the selected normal memory cells in an initial read operation, identifies whether a read disturbance has occurred in response to the data read, and suspends performing a read operation on the selected normal memory cells when a read disturbance is identified.

The non-volatile semiconductor memory device may further include a circuit that is configured to carry out a data copy-back operation to read data from the selected normal memory cells into a first portion of the memory cell array when a read disturbance is identified. The device may further include an erasing circuit that is configured to carry out an erasure operation to erase the data from the selected normal memory cells and initialize a data retention characteristic of the selected normal memory cells after the data copy-back operation has been carried out. The device may further include a programming circuit that, after the erasure operation has been carried out, copies-back the data from the first portion of the memory cell array back into the selected normal memory cells and resumes the read operation on the selected normal memory cells.

Other exemplary embodiments of the present invention provide a method for driving a non-volatile semiconductor memory. An indicating cell is formed in a spare cell area of a memory cell array. The indicating cell is formed to be more susceptible to electrical stress on its retention of data than normal memory cells in the memory cell array. Data is read from the indicating cell and compared with reference data. When the data in the indicating cell is not identical to the reference data, copying data in selected normal memory cells corresponding to the indicating cell to another portion of the memory, erasing the data from the selected normal memory cells, and re-programming the data copied to the other portion of the memory back into the selected normal memory cells.

When the data in the indicating cell is not identical to the reference data, the method may further include erasing the data from the indicating cell, and reprogramming indicating cell. When the data in the indicating cell is not identical to the reference data, a read command may be suspended until the data copied to the other portion of the memory is reprogrammed into the selected normal memory cells.

Other exemplary embodiments of the present invention provide a method for driving a non-volatile semiconductor memory. A plurality of indicating cells are formed in a spare cell area of a memory cell array. The indicating cells are formed to be more susceptible to electrical stress on their retention of data than normal memory cells in the memory cell array, and the indicating cells are formed to have differing amounts of relative susceptibility to electrical stress relative to one another. First data is read from the most susceptible one of the indicating cells and compared with reference data. When the first data is not identical to the reference data, second data is read from the next susceptible indicating cell and compared with the reference data. When the second data is not identical to the reference data, a data copy-back operation is performed on a block or page of the normal memory cells corresponding to the next most susceptible indicating cell, a data erasure operation and an erasure verify operation are performed on the normal memory cells in the block or page, and the copy-back data is reprogrammed into the normal memory cells on which the erase operation and erasure verify operation have been performed.

Accordingly, the data in the flag cells (or indicating cells), which are more susceptible to read disturbance than the normal memory cells, is used as an indicator/flag for when to reprogram data into the normal memory cells to prevent/avoid read errors due to onset of read disturbance in the normal memory cells.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
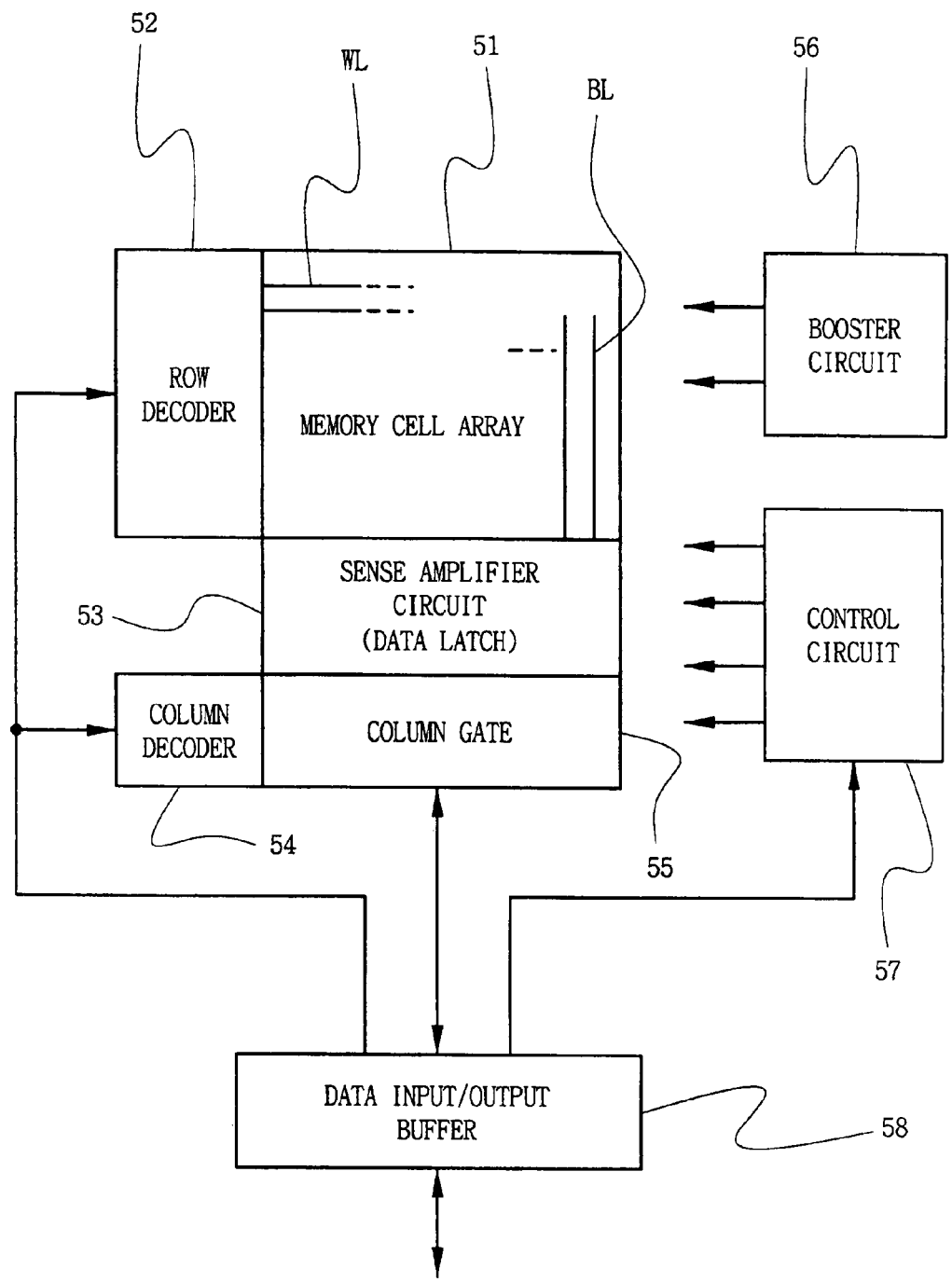
FIG. 1 is a block diagram of a conventional non-volatile semiconductor memory device.
Figure 2:
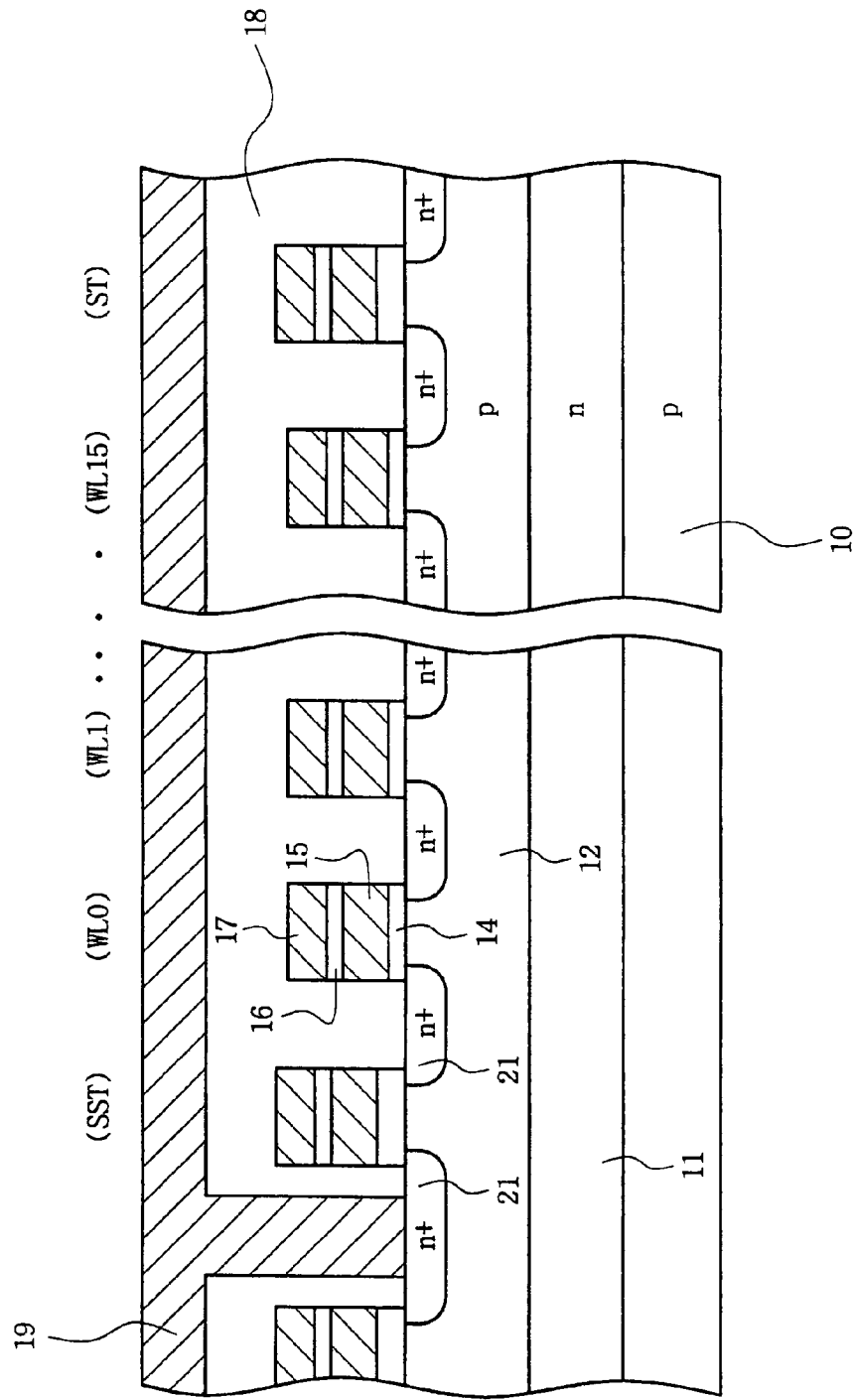
FIG. 2 is a cross-sectional view of memory cells in a memory cell array of FIG. 1.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of films, layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etched/implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Various embodiments of the present invention will now be described with reference to FIGS. 3 to 6.

Figure 3:
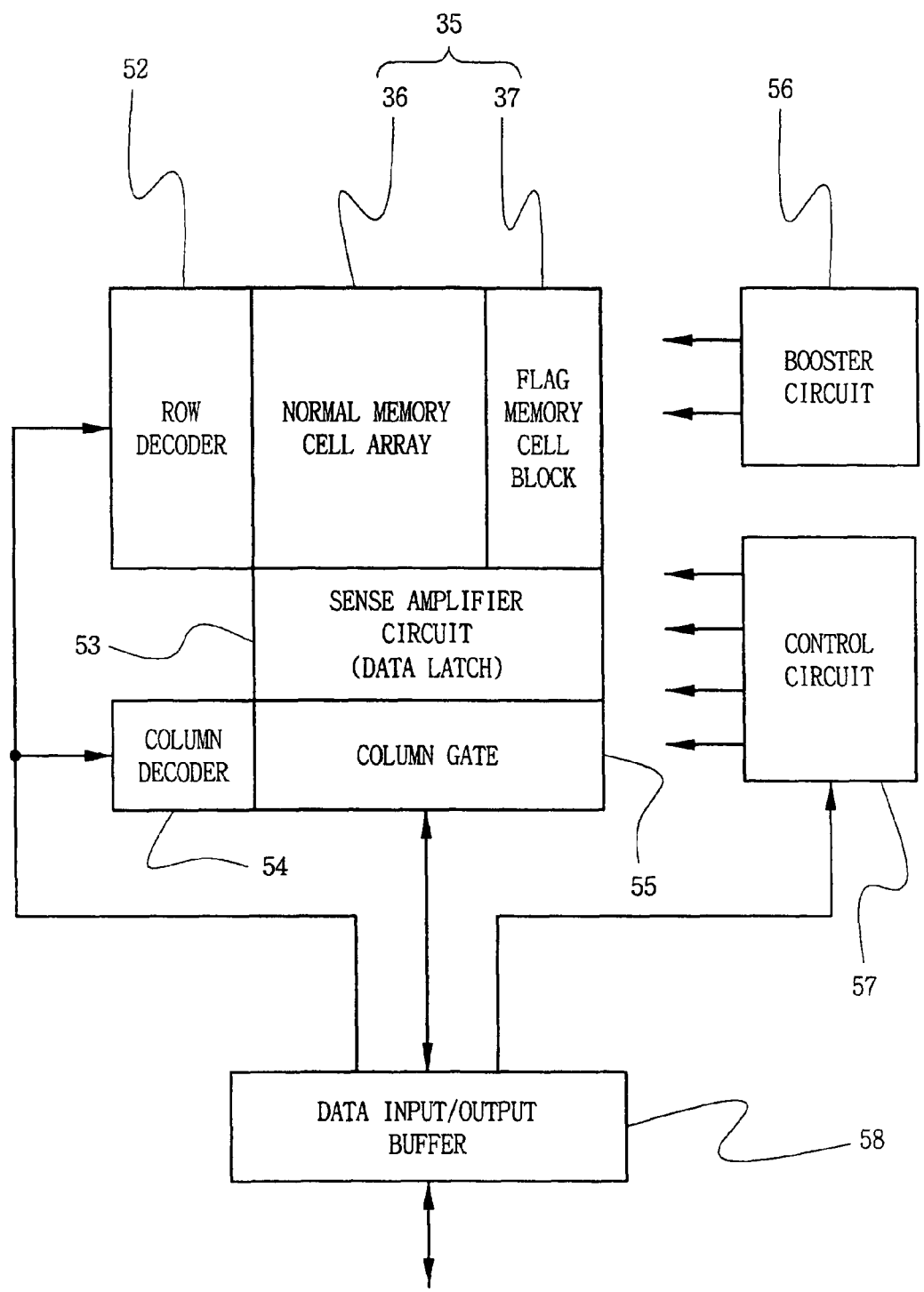
FIG. 3 is a block diagram of a non-volatile semiconductor memory device according to some embodiments of the present invention.
Figure 4:
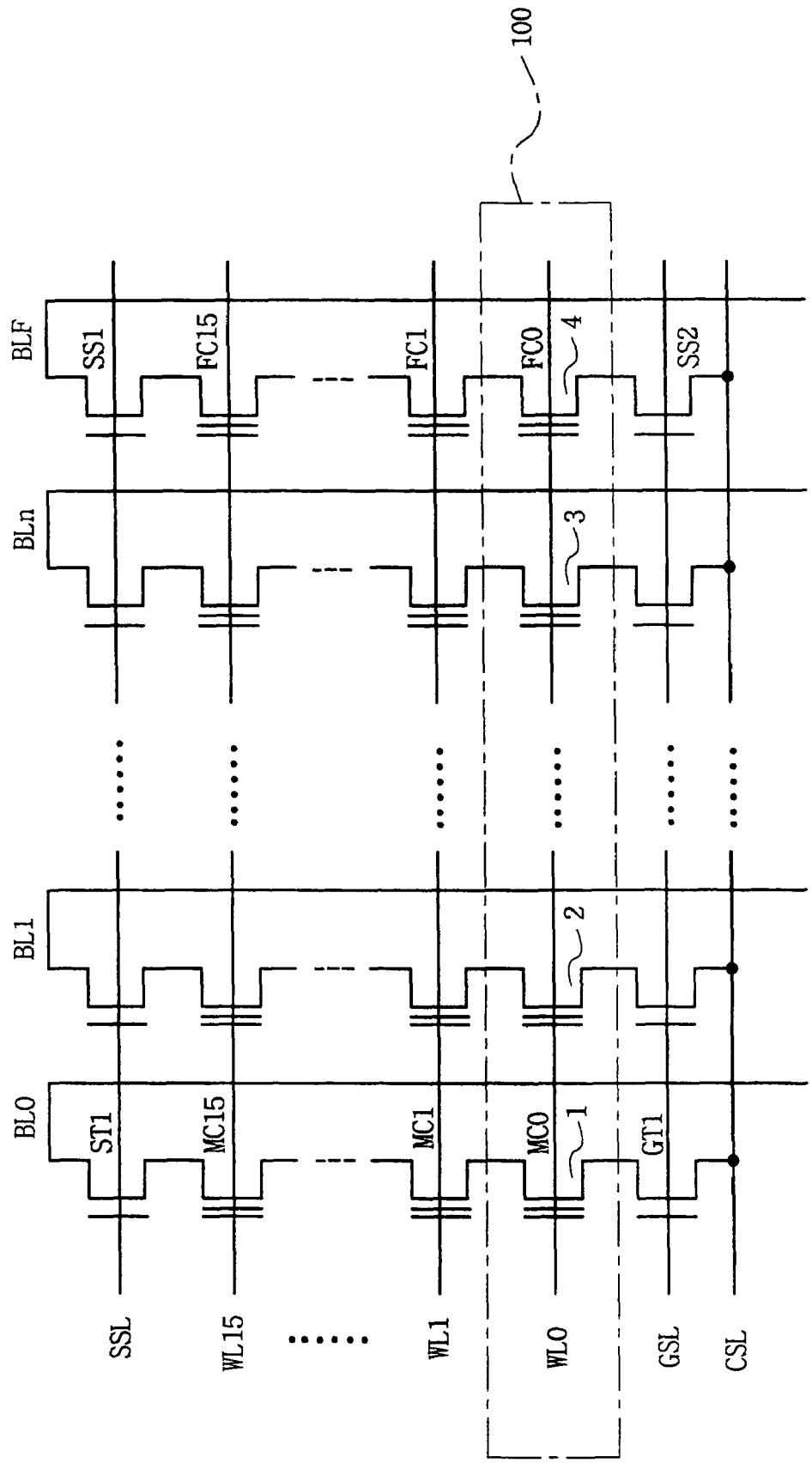
FIG. 4 is an equivalent circuit diagram illustrating a connection structure of memory cells in a memory cell array of FIG. 3.
Figure 5:
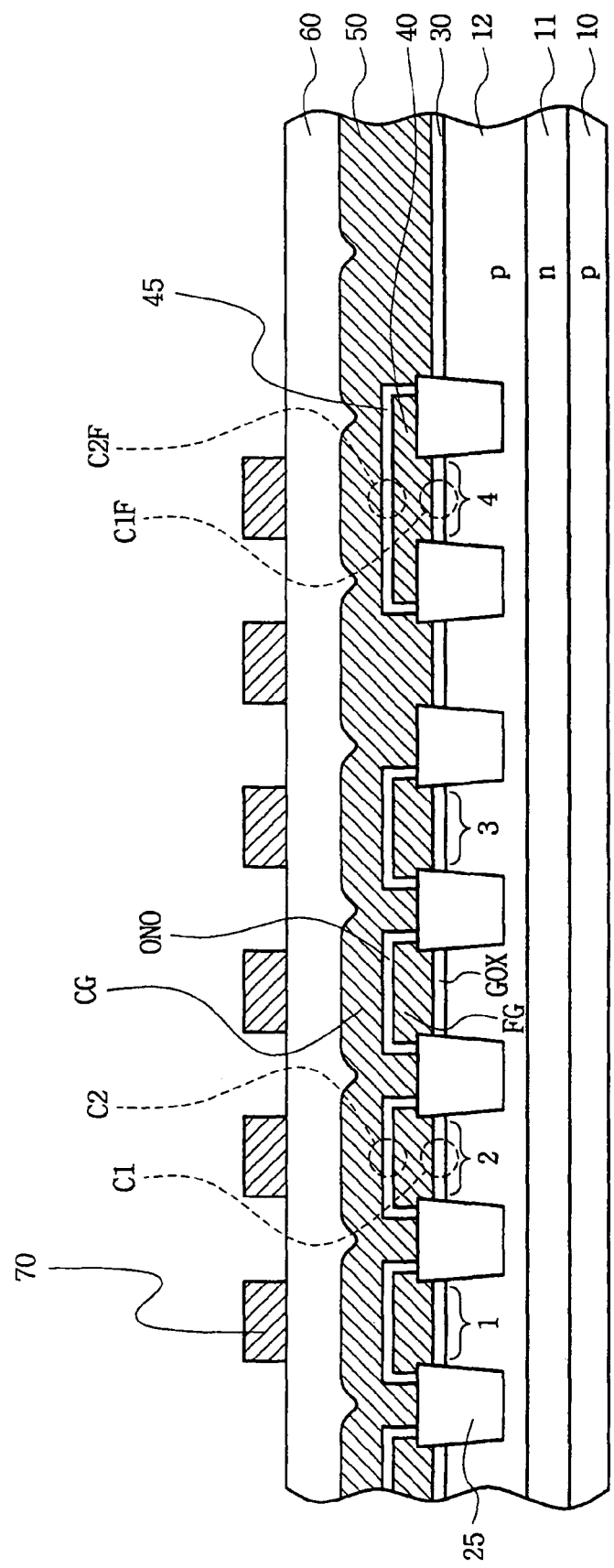
FIG. 5 is a cross-sectional view of memory cells of FIG. 4.
Figure 6:
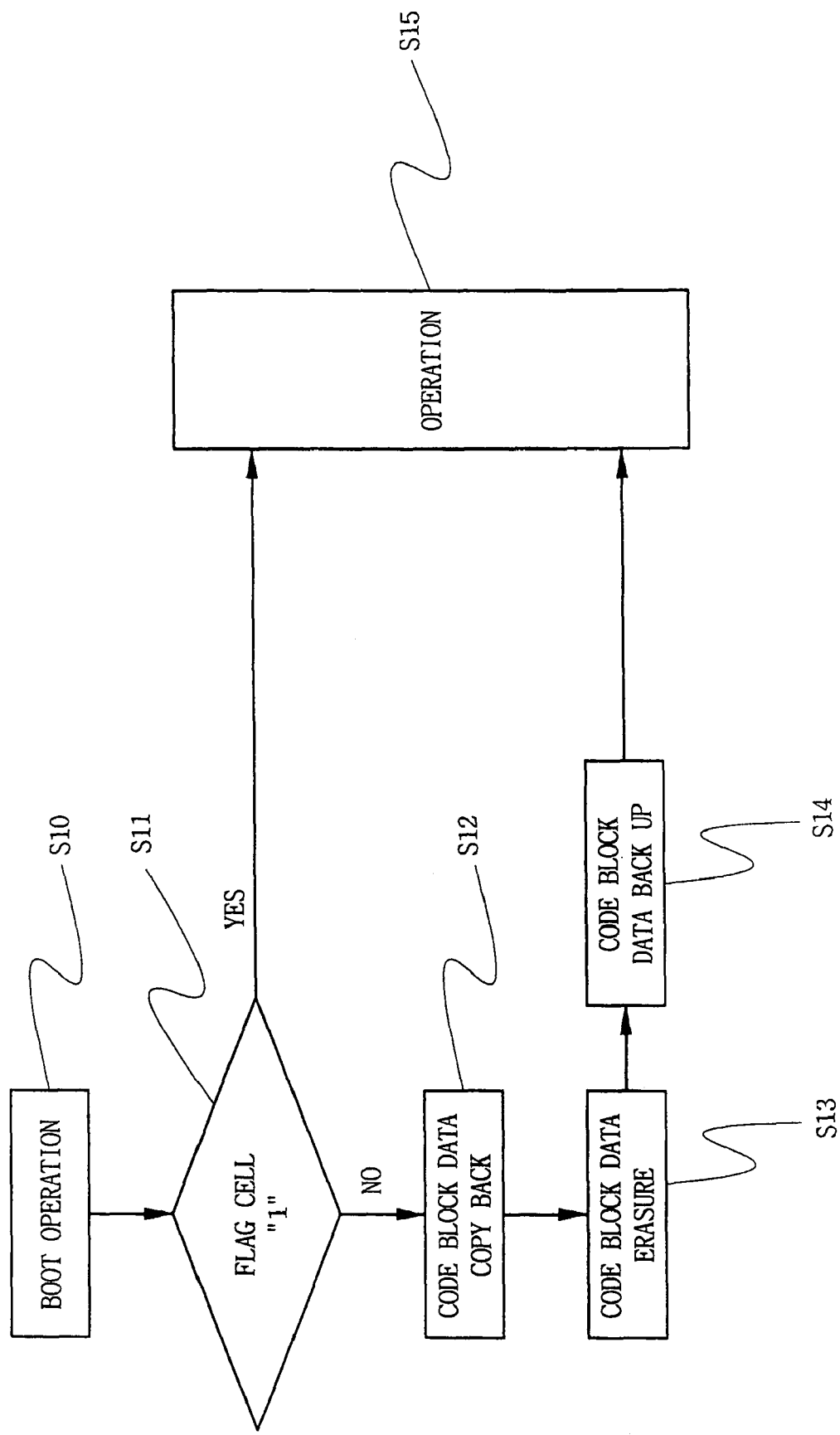
FIG. 6 is a flowchart illustrating operations that may preventing read error caused by read disturbance according to some embodiments of the present invention.

FIG. 3 is a block diagram of a non-volatile semiconductor memory device according to an embodiment of the present invention, FIG. 4 is an equivalent circuit diagram illustrating a connection structure of memory cells in a memory cell array of FIG. 3, FIG. 5 is a cross-sectional view of memory cells of FIG. 4, and FIG. 6 is a flowchart illustrating operations that may prevent/avoid read errors caused by read disturbance according to some embodiments of the present invention.

Referring to FIG. 3, it can be seen that a memory cell array 35 has a different configuration from that shown in FIG. 1. The memory cell array 35 includes a normal memory cell array 36 including normal memory cells and a flag memory cell block 37 including flag memory cells. The flag memory cell or cells in the flag memory cell block 37 are formed to be more susceptible to electrical stress on its retention of data than the normal memory cells so that they can be used monitor change in the data retention characteristics of the normal memory cells.

Referring to FIG. 4, an equivalent connection structure of the memory cells in the memory cell array 35 of FIG. 3 and flag memory cells FC0 to FC15 of one NAND cell string are shown. In FIG. 4, one flag memory cell is disposed in each page unit of the memory. However, the present invention is not limited thereto, as a flag memory cell may be disposed in each memory block or a string of flag memory cells may be disposed in the memory cell array. Alternatively, flag memory cells having different respective degrees of weakness may be used, and may be sequentially referenced from the weakest among the flag memory cells to the strongest among the flag memory cells so as to enable recognition of a degree of disturbance in, change in data retention characteristics of, the normal memory cells.

In FIGS. 3 and 4, a NAND cell string in the normal memory cell array 36 includes a plurality of memory cells MC0 to MC15 connected in series, and the NAND cell string is connected to a corresponding one of bit lines BL0 to BLn via a string selection transistor ST1. A plurality of memory cells 1, 2 and 3 arranged on the same row in the respective NAND cell strings are connected to a corresponding word line WL0 in common.

The transistors of the EEPROM cells MC15 to MC0 of each memory cell string are connected in series between a source of the string selection transistor ST1 and a drain of a ground selection transistor GT1, the drain of the string selection transistor ST1 of each memory cell string is connected to a corresponding bit line, and the source of the ground selection transistor GT1 is connected to the common source line (CSL).

Respective gates of the string selection transistors ST1 are connected to a string select line SSL in common, and respective gates of the ground selection transistors GT1 are connected to the ground select line GSL in common. In each string, control gates of the EEPROM cell transistors MC15 to MC0 are connected to corresponding word lines of the word lines WL0 to WL15 in common, and the respective bit lines BL1 to BLn and BLF are operably connected to the sense amplifier circuit 53 of FIG. 3.

The EEPROM cell transistors, i.e., the plurality of memory cells MC0 to MC15, are initially erased to have a threshold voltage of for example about −3V or less. When a high voltage is applied to a word line of a selected memory cell for a predetermined period of time in order to program the memory cell, the threshold voltage of the selected memory cell is changed to a higher threshold voltage while threshold voltages of unselected memory cells in programming are not changed.

The flag memory cells FC0 to FC15 shown in FIG. 4 are disposed in the flag memory cell block 37 of FIG. 3.

The EEPROM flag memory cell transistors FC15 to FC0 are fabricated in the same type as the normal memory cells, and are connected in series between the source of the flag string selection transistor SS1 and the drain of the ground selection transistor SS2, the drain of the flag string selection transistor SS1 is connected to the corresponding bit line, and the source of the ground selection transistor SS2 is connected to the common source line CSL.

The gate of the flag string selection transistor SS1 is connected to the string select line SSL, and the gates of the ground selection transistors SS2 are connected to the ground select line GSL. The control gates of the EEPROM flag memory cell transistors FC15 to FC0 are connected to a corresponding one of the word lines WL0 to WL15, and the bit line BLF is operably connected to the sense amplifier circuit 53 of FIG. 3.

As shown in FIG. 4, the flag memory cell FC0 has a greater coupling ratio than the normal memory cell MC0. The cell transistor having a greater coupling ratio is more susceptible to voltage stress that causes a soft program of the memory cell or electrical stress that causes read disturbance of the memory cell. As used herein, the coupling ratio refers to a ratio of a capacitance ("C2") between the CG and the FG and a capacitance ("C1") between the FG and the substrate, and the coupling ratio r is expressed as $C2/(C1+C2)$.

To provide a coupling ratio of the flag memory cell that is greater than that of the normal cell, a width of the floating gate FG of the flag memory cell is increased. In this embodiment, as shown in FIG. 5, the coupling ratio C2F/(C1F+C2F) of the flag memory cell 4 is set to be about 30% greater than the coupling ratio C2/(C1+C2) of the normal memory cell. This increases the read disturbance characteristic of the flag memory cell 4 by about two times more than that of the normal memory cell. The width of the floating gate 40 of the flag memory cell 4 is correspondingly determined. In FIG. 5, reference numerals 10, 11 and 12 indicate a p-type substrate, an n-type well, and a p-type well, respectively, and reference numeral 25 indicates a device separation trench. Reference numeral 30 indicates a gate oxide layer, 40 a floating gate, 45 an O/N/O dielectric layer, 50 a control gate, 60 an insulating layer, and 70 a bit line.

Data, which is stored in the flag memory cell fabricated as shown in FIG. 5 to have a greater coupling ratio and to be susceptible to electrical stress, may be referenced to determine whether to back up data stored in the normal memory cells upon initially booting the non-volatile semiconductor memory.

In FIG. 4, each of the flag memory cells FC0 to FC15 is disposed in a corresponding one of the normal memory cells in units of page. The flag memory cells FC0 to FC15 are of the same type as the normal memory cells, but are configured to be more susceptible to electrical stress compared to the normal memory cells.

A reading circuit, which selects normal memory cells corresponding to an input address and reads data from the selected normal memory cells, includes the data input/output buffer 58, the row decoder 52, the column decoder 54, the column gate 55, the sense amplifier circuit 53, and the control circuit 57, as shown in FIG. 3.

The reading circuit first reads data from the flag memory cell corresponding to the selected normal memory cells in an initial read operation, and stops performing the read operation on the normal memory cells when read disturbance is sensed.

The semiconductor memory device may further include a circuit for verify-reading the data from the normal memory cells when the read operation on the normal memory cells stops, and copying back the data to normal memory cells in another area of the memory. The device may further include an erasing circuit for performing an erasure operation to initialize the data retention characteristic of the normal memory cells after the copy-back operation is performed. For the erasure operation, the booster circuit 56 provides a boosted erasure voltage. The erasure operation enables the normal memory cell transistor to have a threshold voltage value in a prescribed range, so that a memory cell characteristic prior to disturbance occurrence is returned.

The device may further include a programming circuit for backing up the copy-back data to the normal memory cells on which the erasure operation has been performed. In this case, the booster circuit 56 generates a higher program voltage than a power supply voltage.

FIG. 6 shows a flowchart of operations, corresponding to steps S10 to S15, that may prevent a read error caused by read disturbance.

In step S10, when a non-volatile semiconductor memory device is powered, boot loading is initiated. In step S11, data that has been pre-stored in a corresponding flag memory cell is read (flag cell verify read). If the read data is normal, the process proceeds to step S15, in which a normal operation is performed. Reading the data in step S11 may be performed by a sense amplifier. If the flag memory cell that should retain data "1" instead outputs data "0", it is determined that a read disturbance has occurred which may similarly have effected normal memory cells and, accordingly, steps S12, S13, and S14 may be performed in the semiconductor memory device.

In step S12, a data copy-back operation is performed by reading data from the affected normal memory cells, verifying the data, and, if verified, moving the data to normal memory cells of another area of the memory. The verifying step may further include correcting one or more errors identified in the read data.

In step S13, an erasure operation is performed to initialize the data retention characteristic of the affected normal memory cells after the copy-back operation is performed. The erasure operation enables the memory cell transistor to return to a threshold voltage value in a prescribed range, i.e., to a memory cell characteristic prior to occurrence of the disturbance. This data erasure operation is performed on all normal memory cells in the block or page of the memory cell array. As a result, the threshold voltage of the normal memory cell transistor soft-programmed due to the read disturbance is returned to a normal threshold voltage by the erasure operation. The erasure operation is substantially the same as the above-described erasure operation.

In step S14, a program operation is performed to back up the copy-back data to the normal memory cells on which the erasure operation has been performed. The program operation is substantially the same as the above-described program operation.

The copy-back, erase, and program operations may be sequentially performed on the flag memory cells (or indicating cells), similar with the normal memory cells. If data in the flag memory cells is not identical to the reference data, a read command suspends, and the read operation can then be resumed after the reprogram operation of the affected normal memory cells is completed.

According to the embodiments of the present invention as described above, because data in the flag memory cells, which are configured to be more susceptible to read disturbances compared to the normal memory cells, is used as an indicator of when to back up data in the normal memory cells, the data retention capability of the memory cells may be improved. Moreover, because the flag memory cells are configured to be more susceptible to read disturbances than the normal memory cells, identifying a read disturbance in the flag memory cells may serve as a forewarning of an imminent read disturbance that may subsequently occur to the normal memory cells. Accordingly, data may be read from the normal memory cells before a read disturbance may occur thereto, and the data can be reprogramming into the normal memory cells to avoid such disturbance. Thus, various embodiments of the present invention may improve the reliability of non-volatile semiconductor memories.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A non-volatile semiconductor memory with a memory cell array comprising:
   normal memory cells that are configured to store data; and
   a plurality of flag memory cells having different respective degrees of weakness in their retention of data relative to the normal memory cells and which are used to monitor a data retention characteristic of the normal memory cells, wherein the non-volatile semiconductor memory is configured to recognize a degree of disturbance in and change in data retention characteristic of the normal memory cells using the plurality of flag memory cells and respond thereto by backing up data stored in the normal memory cells, wherein the flag memory cells have a greater coupling ratio than the normal memory cells.

2. A non-volatile semiconductor memory with a memory cell array comprising:

normal memory cells that are configured to store data; and a plurality of flag memory cells having different respective degrees of weakness in their retention of data relative to the normal memory cells and which are used to monitor a data retention characteristic of the normal memory cells, wherein the non-volatile semiconductor memory is configured to recognize a degree of disturbance in and change in data retention characteristic of the normal memory cells using the plurality of flag memory cells and respond thereto by backing up data stored in the normal memory cells, wherein the flag memory cells are configured to be more susceptible to soft programming than the normal memory cells.

3. A non-volatile semiconductor memory with a memory cell array comprising:

normal memory cells that are configured to store data and a plurality of flag memory cells having different respective degrees of weakness in their retention of data relative to the normal memory cells and which are used to monitor a data retention characteristic of the normal memory cells, wherein the non-volatile semiconductor memory is configured to recognize a degree of disturbance in and change in data retention characteristic of the normal memory cells using the plurality of flag memory cells and respond thereto by backing up data stored in the normal memory cells, wherein the flag memory cells are configured to be more susceptible to read disturbance of stored data therein than the normal memory cells.

4. An electrically erasable programmable read only memory (EEPROM) type non-volatile semiconductor memory with a memory cell array comprising:

normal memory cells that are configured to store data, the nomial memory cells including MOS transistors each having a control gate and a floating gate; and a plurality of flag memory cells having different respective degrees of weakness in their retention of the stored data relative to the normal memory cells and is which are used to monitor a data retention characteristic of the normal memory cells, wherein the flag memory cells are configured to be more susceptible to read disturbance of stored data therein than the normal memory cells, and wherein the non-volatile semiconductor memory is configured to recognize a degree of disturbance in and change in data retention characteristic of the normal memory cells using the plurality of flag memory cells and respond thereto by backing up the data stored in the normal memory cells.

5. A non-volatile semiconductor memory with a memory cell array comprising:

normal memory cells that are configured to store data; and a plurality of flag memory cells having different respective degrees of weakness in their retention of data relative to the normal memory cells and which are used to monitor a data retention characteristic of the normal memory cells, wherein the non-volatile semiconductor memory is configured to recognize a degree of disturbance in and change in data retention characteristic of the normal memory cells using the plurality of flag memory cells and respond thereto by backing up data stored in the normal memory cells, wherein the flag memory cells each comprise a floating gate having a greater width than floating gates of the normal memory cells.

6. The memory according to claim 4, wherein the flag memory cells each comprise a floating gate having a greater width than that of the floating gates of the normal memory cells.

* * * * *